United States Patent [19]

Robinson et al.

[11] 4,346,301
[45] Aug. 24, 1982

[54] ION IMPLANTATION SYSTEM

[75] Inventors: William P. Robinson, Newbury Park; Robert L. Seliger, Agoura, both of Calif.

[73] Assignee: Hughes Aircraft Company, Culver City, Calif.

[21] Appl. No.: 245,285

[22] Filed: Mar. 19, 1981

Related U.S. Application Data

[63] Continuation-in-part of Ser. No. 61,578, Jul. 30, 1979, Pat. No. 4,258,266.

[51] Int. Cl.³ ............................................. G01N 23/00
[52] U.S. Cl. .................................. 250/492.2; 250/358
[58] Field of Search ........... 250/492 R, 492 A, 492 B, 250/398, 442; 313/359, 360

[56] References Cited

U.S. PATENT DOCUMENTS

| | | | |
|---|---|---|---|
| 3,983,402 | 9/1976 | Arndt et al. | 250/492 A |
| 4,013,262 | 3/1977 | Schott | 250/492 A |
| 4,017,403 | 4/1977 | Freeman | 250/492 A |
| 4,163,151 | 7/1979 | Bayless et al. | 250/423 R |
| 4,276,477 | 6/1981 | Enge | 250/492 A |

Primary Examiner—Bruce C. Anderson
Attorney, Agent, or Firm—Allen A. Dicke, Jr.; W. H. MacAllister; W. J. Bethurum

[57] ABSTRACT

A plurality of beam generating units 76, 78, 80 and 82 each produces separated rectangular ion beams for implantation onto a targets 52 and 54 rotatively moving therepast. Each rectangular footprint is long in the direction of motion and is scanned transversely to the direction of motion. A plurality of beam generating units can be positioned adjacent to each other to multiply implant targets because of the compact structure of the separated ion source.

10 Claims, 10 Drawing Figures

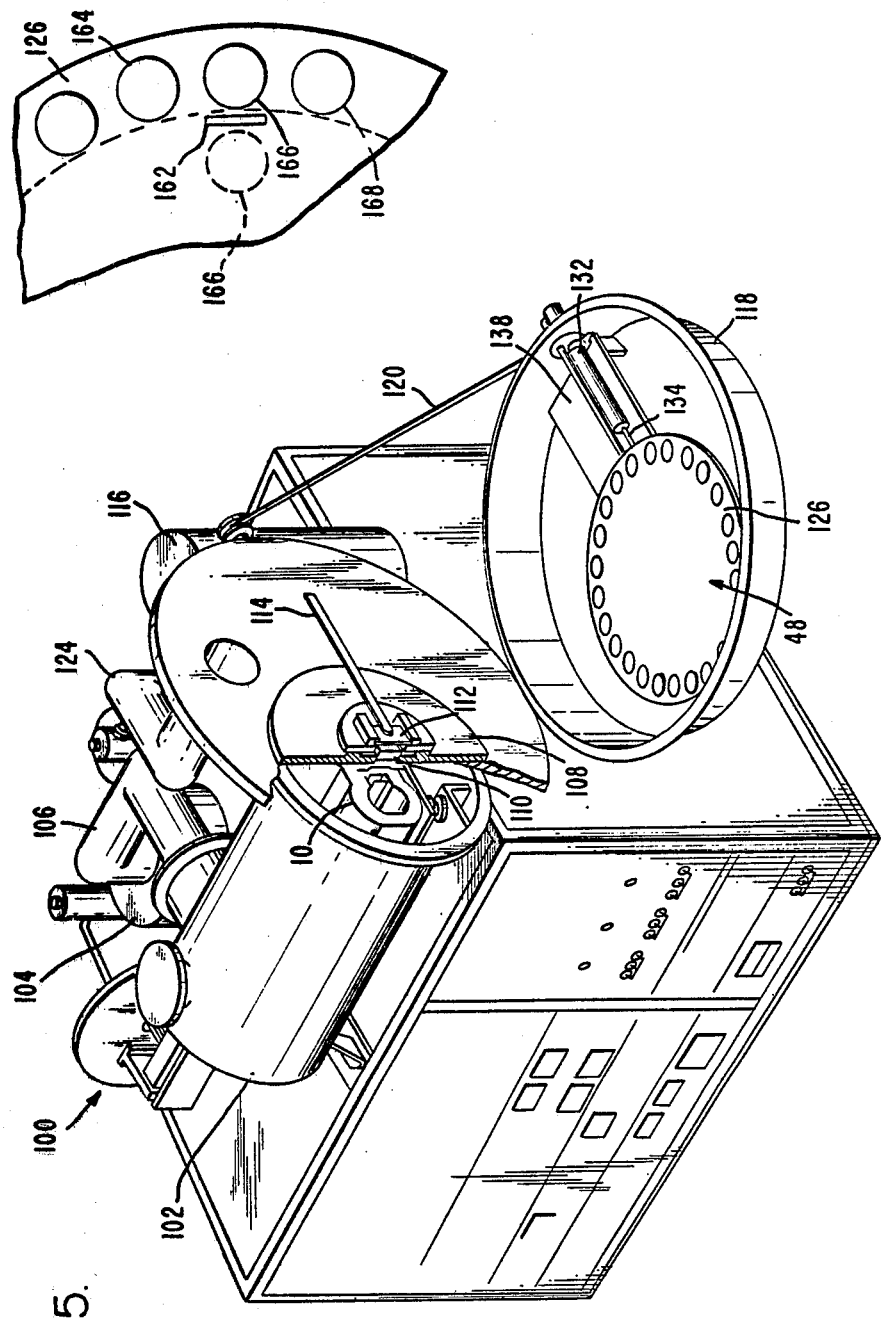

ION IMPLANTATION SYSTEM

CROSS REFERENCE

This application is a continuation-in-part of patent application Ser. No. 61,578, filed July 30, 1979, now U.S. Pat. No. 4,258,266.

BACKGROUND OF THE INVENTION

This invention is directed to a compact ion implantation system which has a separated ribbon beam ion source which has geometry which permits beam traverse across the wafer with minimum waste beam for maximum productivity and employs the same magnetic field for both the ion source and separator. The separated ribbon beam ion source is sufficiently compact that a plurality of such sources can be placed adjacent to each other for successive ion beam impingement on the same target or adjacent targets.

Prior ion implantation beams sources were comprised of separate functional components which were connected together to form the ion beam line. An ion source was used and it had its own magnetic field structure, if such was required, for the production of the ion beam. Ion separation downstream from the ion source required additional separation components. Due to the separate-element approach to the problems, the beam line is unnecessarily long and complex. These disadvantages are particularly difficult in the case of high current low energy beams because severe space charge expansion occurs in the region between the ion source and separator. Attempts to locate the separator just downstream of the ion source were unsuccessful because the magnetic fields interfered. That is, the axial magnetic field in the ion source was disturbed by the transverse magnetic field of the separator.

With the present close coupled, compact ion source, a small target chamber can be employed with several of the separated ion sources working on the same target or the same target wheel to provide higher ion dosage capability.

A suitable ion source is shown in U.S. Pat. No. 4,163,151.

SUMMARY

In order to aid in the understanding of this invention it can be stated in essentially summary form that it is directed to an ion implantation system wherein a plurality of compact separated ribbon beam ion sources, which are sufficiently compact that they can be placed adjacent to each other, direct ions at a target so that multiple beams impinge upon the same target. The rectangular cross-section of the beam produced by the ion source also reduces the effects of space-charge and enables mass separation to occur in a relatively weak magnetic field.

It is thus an object of this invention to provide an ion implantation system which comprises a plurality of separated ion sources which have both the ion production structure and the ion separation structure therein so that the plurality of sources form an ion implantation system wherein a plurality of beams can be directed against the same target to increase the implantation dosage or area implanted.

It is a further object to provide an ion implantation system wherein the beam line is short to provide a compact system which is sufficiently small that a plurality of ion sources can be incorporated together into the system for increased implantation.

Other objects and advantages of this invention will become apparent from a study of the following portion of the specification, the claims and the attached drawings.

BRIEF DESCRIPTION OF THE DRAWINGS

FIG. 5 is a perspective view of one form of equipment which houses a single source ion implantation system.

FIG. 6 is a front view of a portion of the wafer wheel of FIG. 5 with parts broken away.

DESCRIPTION OF THE PREFERRED EMBODIMENTS

Figure 1:
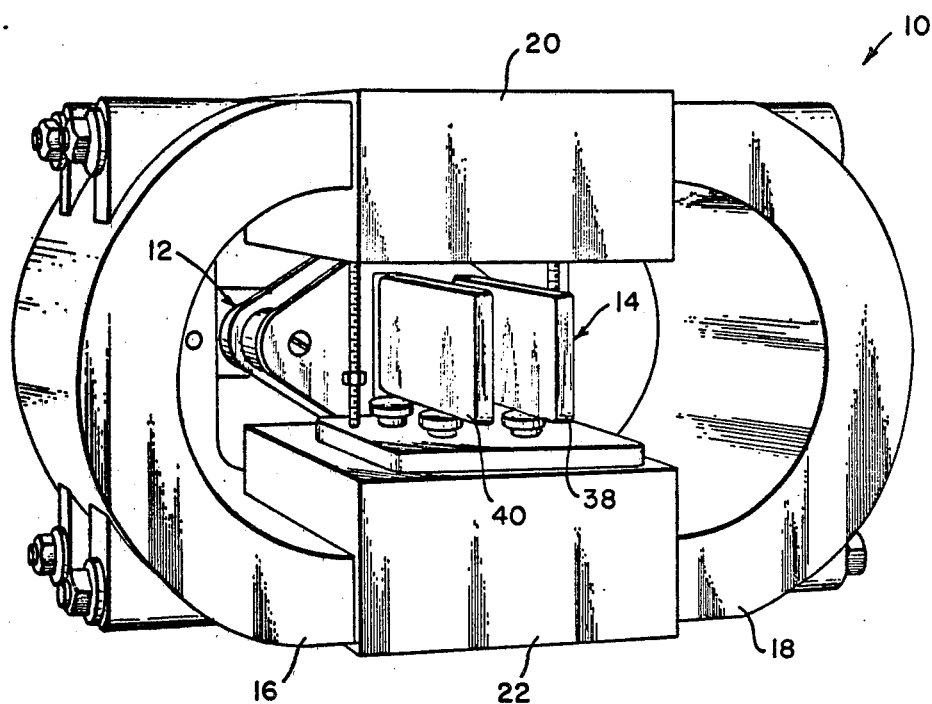
FIG. 1 is a perspective view of one of the separated ion sources employed in the system of this invention.
Figure 2:
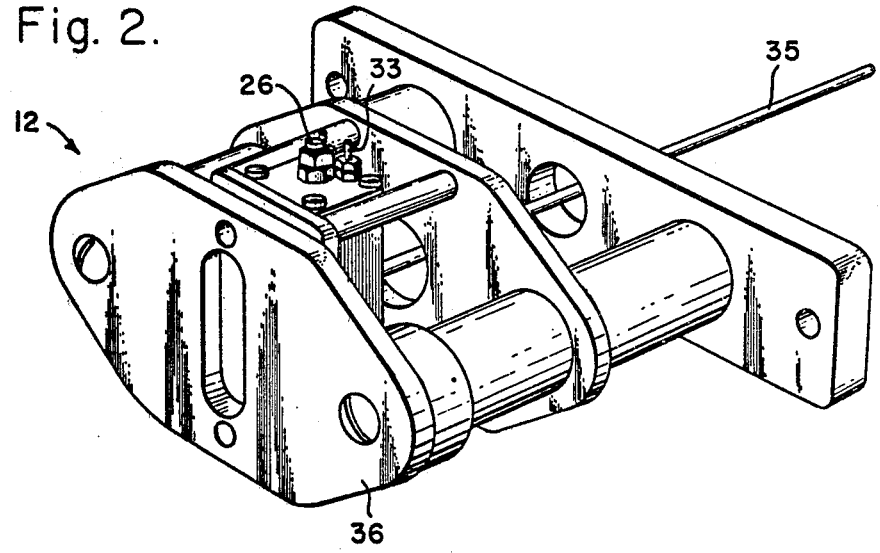
FIG. 2 is an enlarged perspective of the ion source portion of the separated ion source equipment.
Figure 3:
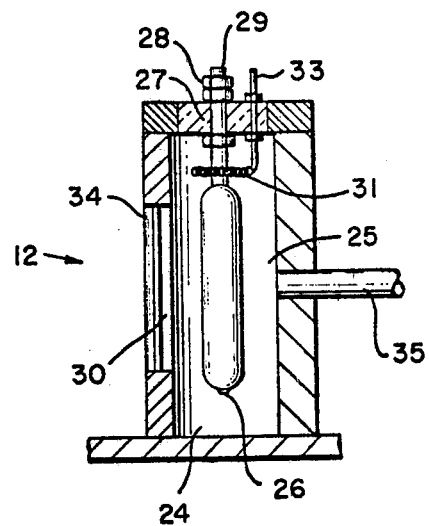
FIG. 3 is a vertical section through a portion of the ion source.
Figure 4:
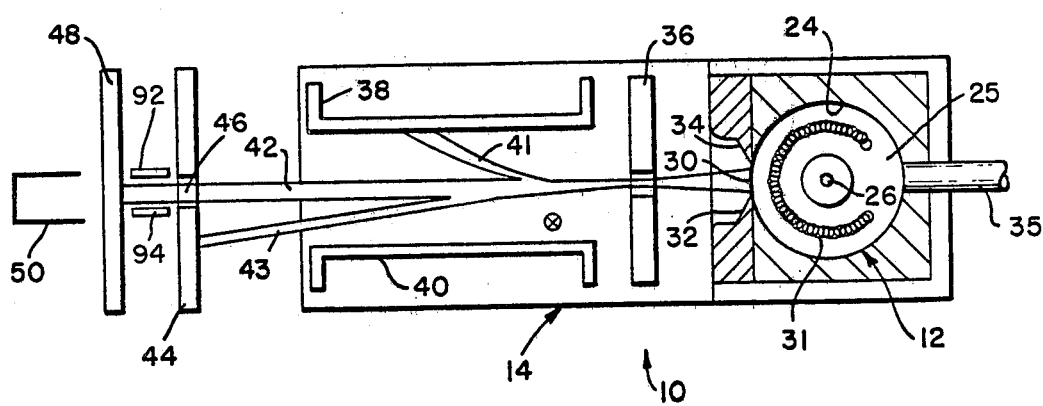
FIG. 4 is a schematic horizontal section through the separated ion source showing the interrelated components.

A single compact separated ion source is generally indicated at 10 and FIGS. 1, 4 and 5. It comprises ion source 12, which is seen in FIGS. 2, 3, and 4 and ion separator 14 which is seen in FIGS. 1 and 4. Magnets 16 and 18, see FIG. 1, connected to pole pieces 20 and 22, provide a magnetic field across both the ion source and the ion separator.

Ion source 12 has a Penning discharge type configuration. The cathode 24 has an interior cylindrical cathode surface. Anode 26 is positioned within the cathode and is electrically insulated therefrom by means of insulator 27 in the top cover 28. Anode 26 extends through the top-cover insulator 27 to provide a terminal 29 to which the anode voltage is applied. Hot filament 31 is positioned adjacent the anode and has terminals 33 for hot filament energization which also extend from the cathode space through the top cover. The gas to be ionized is introduced into the discharge chamber 25 by means of a feed tube 35. The radii of the anode and cathode surfaces, the gas pressure and the magnetic field strength in the interelectrode spaces are such that a Penning low pressure glow discharge is formed. The Penning discharge causes ionization and it is from this discharge plasma that the ions are extracted.

The magnetic field is supplied in a direction parallel to the anode and has a value of about 1100 gauss at the center of the ion source. In the presence of the gas to be ionized, with a pressure in the discharge chamber in the order of about 75 pascal, a Penning discharge is sustained in discharge chamber 25 between the anode and cathode with a voltage of 100 to 150 volts. Electrons, which ionize the gas molecules, are provided by hot filament 31. The magnetic field causes the path length of electrons traveling between the cathode and the anode to be much greater than their separation. This increases the probability of ionization and in turn results in a gas consumption which is less than one tenth the gas consumption required without a magnetic field. After ignition, the discharge in the plasma operates at a discharge current of 100 to 2000 milliamperes. The discharge is very stable and since the voltage is lower than for most types of cold cathode discharge, sputtering is less of a problem.

Ions are extracted from the discharge through a slit 30 in the discharge chamber 25. The slit 30 has a high aspect ratio rectangular cross section whose long dimension is shown in FIG. 3 and whose narrow dimension is shown in FIG. 4. The extraction geometry is based on the design criteria developed by J. R. Pierce. Electrode 32 and 34 adjacent the slit are Pierce-type electrodes to prevent space charge effects from spreading the beam. Furthermore, the strip beam geometry of high aspect ratio which is typically 50 times higher than its width, reduces space charge effects and it is compatible with the separator geometry. Accelerator electrode 36 is positioned adjacent the ion extraction opening and accelerates the ion beam into the ion separator.

Ion separator 14 comprises separator plates 38 and 40 which are positioned in the magnetic field and oriented parallel to the ribbon beam. A power supply applies a voltage of 1500 volts across the separator plates to provide an electric field at right angles to or crosswise to the magnetic field which is perpendicular to the paper in FIG. 4. Thus, the magnetic field and the electric field define the E×B ion separator. The same permanent magnet is used to provide the magnetic field in the ion source and thus it is possible to reduce the system length as compared to other designs. Furthermore, in the present design, the permanent magnet is within the vacuum envelope 102. Thus, the permanent magnetic field can be provided at very much lower cost than the customary external electro-magnet. The magnetic field in the separator region has a value of 1100 gauss.

Another suitable E×B separator is shown in patent application Ser. No. 151,009 filed May 19, 1980 by Richard Vahrenkamp where focusing plates are used in the analyzer.

The main beam is indicated at 42 in FIG. 4. This beam has been analyzed, with impurity beams 41 and 43 being separated therefrom. Aperture plate 44 has analyzing opening 46 therein which permits the main beam to pass through the target holder 48. The target holder is preferably movable into the path of the beam, and may have an opening herein so that when the opening in the target holder is moved in line with the beam, the beam can pass through to Faraday cup 50. By use of the cup, beam data can be obtained.

In a particular embodiment, the slit 30 through which the beam is extracted measures 1 inch by 0.020 inches. When the source is operating on argon of $BF_3$, with a ten kV extraction voltage, the total current is 2.5 milliamperes. When the gas is $BF_3$ operating under these conditions, 150 microamperes of boron is delivered through analyzing opening 46 to the target.

The ribbon shape of the beam is critical to this invention. In a ribbon shaped beam, a high beam current can be achieved with a narrow beam. The narrow beam configuration very much reduces the spreading of the beam due to space charge effects, as compared to a circular beam of the same current. Furthermore, in analyzing the beam, the impurities can be laterally deflected from the ribbon beam, but need only be deflected a small angle because the main beam can pass through an analyzing opening which is in the shape of an elongated slot, having generally the same proportions as the extraction slot at which the ions are extracted from the plasma. Thus, by using a beam which is taller than it is thick, and causing analyzing deflections of the impurities in the direction of the thickness direction, a high brightness, high flux density ion beam can be achieved by minimum spreading due to space charge effects and maximized analyzing.

An embodiment of the ion implantation system of this invention which incorporates the separated ion source 10 is generally indicated at 100 in FIG. 5. System 100 has vacuum envelope 102 which houses the ion source 10. Ion source 10 is oriented in such a direction that its ribbon beam is horizontally directed toward the front right in FIG. 5 with the height of the beam, upright in FIG. 5, being the longer transverse section through the beam. Envelope 102 is pumped by vacuum pump 104 through vacuum connection 106. The right end of envelope 102 is substantially closed by cover 108 which is half broken away in FIG. 5. Cover 108 only has slot 110 therethrough. Sliding gate 112 can be slid from a position where it covers slot 110 to a position where it uncovers slot 110. Sliding gate 112 is sealed when closed so that envelope 102 can be maintained at vacuum while the target chamber volume on this slide of cover 108 is open. Gate operator 114 extends to the outside of the vacuum enclosure so that the gate can be externally operated.

Flange 116 is mounted behind cover 108. Target chamber cover 118 is pivoted to the bottom of flange 116 and can be swung to the open position shown in FIG. 5. Stop 120 holds cover 118 in a horizontal position when open. When raised against flange 116, a target chamber cover 118 can be sealed thereto to form an enclosed target chamber which can be evacuated. Vacuum pump 122 is connected through vacuum connection 124 to the target chamber to permit the target chamber to be evacuated. By closure of sliding gate 118, the target chamber can be opened by lowering cover 118, while maintaining the vacuum in vacuum envelope 102. The maintenance of the vacuum on the ion source is helpful to the ion source and the reduction in volume which must be pumped down after a change in targets decreases the down time between the implantation on one set of wafers and the next set of wafers.

Wafer wheel 126 is mounted for rotation on a wheel shaft. Wafer wheel drive motor 130 drives female spline 132 which in turn drives male spline 134 which is connected through a bevel gear box to drive wafer wheel 126. A plurality of wafers is mounted on the front of wafer wheel 126. These wafers are of semiconductor material and are masked to receive ions from the ion beam 162, see FIG. 6, for implantation therein. The masking controls the implantation pattern. FIG. 6 illustrates wafers 164, 166, and 168 secured to the wafer wheel. During the implantation process the wheel 126 is rotated so that the implantation is evenly distributed. For proper dosage accuracy, the beam flux onto the wafer must be uniform within 1 percent over the wafer area. To accomplish this, the wafer wheel is rotated around its axis to rotate the wheel and the wafer is carried thereby past the impingement pattern of beam 162. As is seen in FIG. 6, beam 162 is a ribbon beam and its height is perpendicular to the radius of the wafer wheel. With rotation of the wafer wheel the wafers move in an accurate direction, but at the ribbon beam they are generally moving parallel to the height cross-section of the beam. The wafer wheel is rotated and traversed so that the wafers pass under the beam pattern on the wheel. In addition to the rotary motion of the wheel, it is moved in the direction parallel to male spline shaft 134 which is a direciton perpendicular to the longer cross-section. It is the left to right direction in FIG. 6. The importance of this direction of transverse is that scanning must occur from a point where the beam pattern is on one side of the wafer at a starting point, with motion of the wheel perpendicular to its rotational axis while the pattern scans across the wafer areas, to a point where the pattern is outside of the wafer areas, as shown in dotted line FIG. 6. In this way scanning of the wafer wheel cross-wise of the beam from a point where the pattern is on one side of the wafers to a point where the pattern is on the other side of the wafers can be accomplished with less traverse of the wafer wheel because of the narrowness of the ribbon beam in the direction of traverse. In this way, the use of a ribbon beam improves productivity of the system.

Figure 7A:
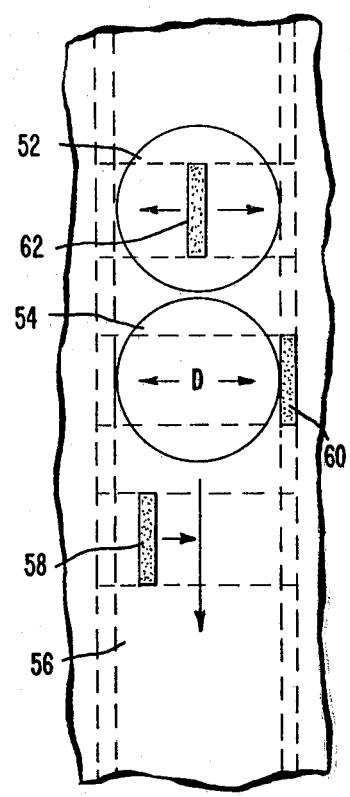
FIG. 7a shows the manner in which the impingement areas or footprints of three rectangular ion beams are scanned over a round target such as a semiconductor slice.
Figure 7B:
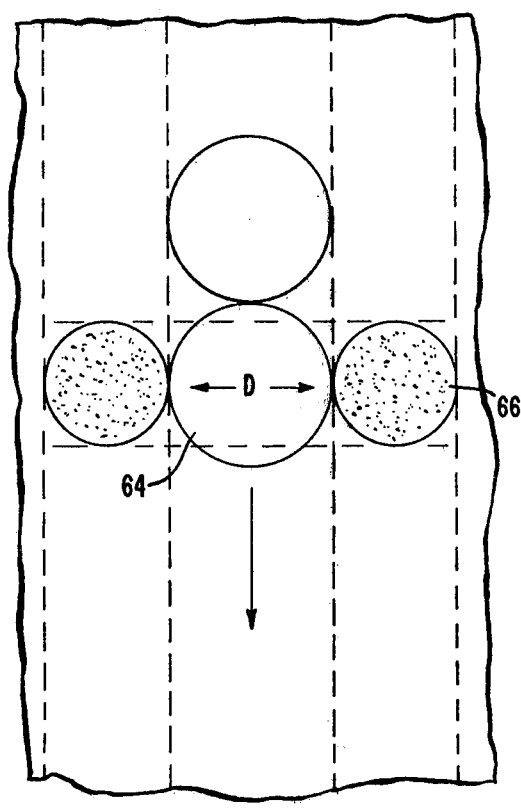
FIG. 7b shows the overscan necessary for uniform implantation with a single large round high current ion beam.

The compact ion beam source which produces an analyzed rectangular high current beam permits combining of several compact analyzed ion beam sources or beam generating units so that they can cooperatively implant the same target. In FIG. 7a, targets 52 and 54 are mounted on target drum 56 which moves the targets past the footprints of a plurality of ion sources. In In FIG. 7a the targets 52 and 54 are discs, such as semiconductor wafers, although they can be of different shape. FIG. 7a also shows footprints 58, 60 and 62 which are successively scanned over the targets on the target drum. The target drum corresponds to wafer wheel 48 in the single implantation embodiment of FIGS. 5 and 6. FIG. 7a illustrates that the overscan of one full width of the rectangular ion beam covers a minimum overscan width to minimize lost implantation time. This minimum overscan is accomplished by means of the rectangular ion beam. Such overscan of one beam width is required for a uniform implantation. The rectangular ion beams, with their footprints shown in FIG. 7a, can be compared to the usual circular ion beam illustrated in FIG. 7b. In FIG. 7b the target 64 is scanned by a single large high current beam having a round footprint 66. The amount of overscan, equal to one beam diameter on each side of the target, requires excessive nonproductive time, and for this reason the round beam is undesirable, as has also been shown with respect to FIG. 6.

Figure 8:
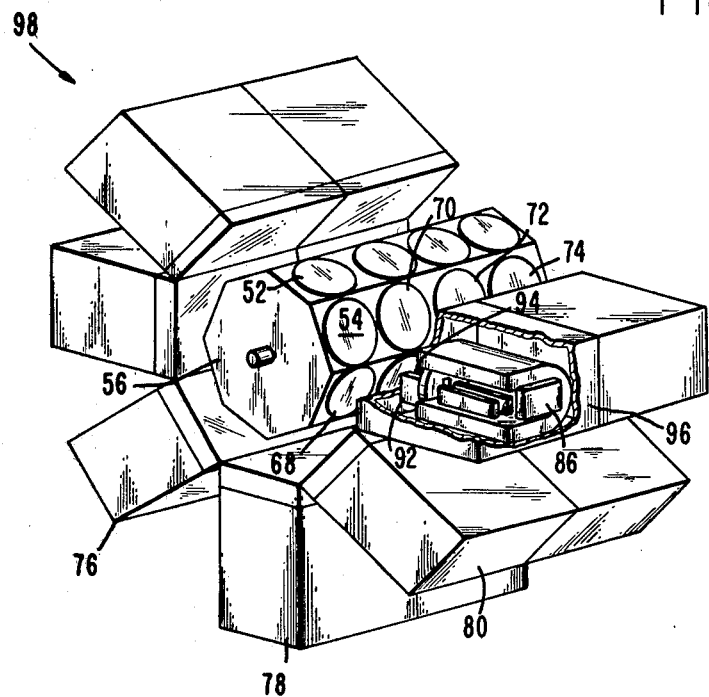
FIG. 8 is a perspective view of a first preferred embodiment of a multiple ion implantation system in accordance with this invention showing the manner in which the compact separated ion sources can be operated adjacent to each other to obtain multiple beam scan successively over the same target.

In FIG. 8 the advantages of compact beam generating units used in multiple can be seen for implanting a large number of wafers in short time in one machine cycle. As is seen in FIG. 8, drum 56 has four circumferential rows 68, 70, 72 and 74 of wafers arranged around the drum and the wafers in the rows may be arranged in longitudinal lines. Target wafers 52 and 54 are in the first row 68.

Circumferentialy arranged around drum 56 is a plurality of beam generating units. Sixteen beam generating units are shown in FIG. 8, eight in a near and eight in a far row, each arranged about 45° apart. Two units are broken away in each of the two rows to show the drum structure in FIG. 8. The geometry of the previously described compact beam generating units permits a plurality of them to be closely positioned with respect to each other. Beam generating units 76, 78, 80 and 96 are particularly indicated in FIG. 8, and comprise half of the beam generating units in the near row in FIG. 8. A similar circular assemblage of eight such beam generating units is also indicated at the far end of FIG. 8. In view of the fact there are two rows of beam generating units circumferentialy arranged in the implantation device of FIG. 8 and there are four rows of wafers, the beam generating units are arranged so that half of them, preferrably alternate beam generating units in the same row, be deflected to different target rows. For example, beams generating units 76 and 80 may be deflected to the right to implant row 70, while beam generating units 78 and 82 are deflected to the left to implant row 68. This deflection is in addition to the axial scan of the rectangular ion beams. By this construction, each of the rows 68, 70, 72 and 74 of target wafers has four beam generating units providing ion beams for implanting therein.

Beam generating unit 82 is broken away in FIG. 8 to show its C-shaped magnet 84, ion source 86, and analyzer plates 88 and 90 which control the path of the desired ion species and deflect the path of the undesired species. This structure is the structure shown in FIG. 4. In addition, deflection plates 92 and 94 are provided to provide the deflection bias necessary to cover the correct row and scan the beam footprint in the axial direction of drum 56 while the drum rotates around its axis to provide for uniform impingement. The housings, for example housing for unit 96, are preferrably vacuum type housings with a beam outlet gate such as gate 112 illustrated in FIG. 5 so that the beam generating unit may be maintained in vacuum while the target drum is changed. Furthermore, housing 96 may contain beam accelerator electrodes positioned in accelerator portion 97 either upstream or downstream from the deflection plates. The implantation system 98 illustrated in FIG. 8 thus provides implantation by four beams onto each target wafer in each row 68, 70, 72 and 74 as the target drum 56 rotates and as the beam footprints are deflected in the axial direction of the drum and width-wise of the rectangular beam footprint. The small size of each beam generating unit thus permits multiple application of beam generating units and increases target implantation rate. The use of plurality rectangular ion beams is superior to using one larger, usually round ion beam, because the space charge effect within the large ion beam would cause excessive beam spreading and so much time would be lost during implantation, as illustrated in FIG. 7b.

The structure of FIG. 8 represents a low energy ion implantation system, for example in the energy range of 5–100 kev. Very high current can be achieved, in the order of 20–50 milliamperes, depending upon the ion species. This total current is the total of four beam generating units successively operating on one set of targets, as illustrated in FIG. 8.

Figure 9:
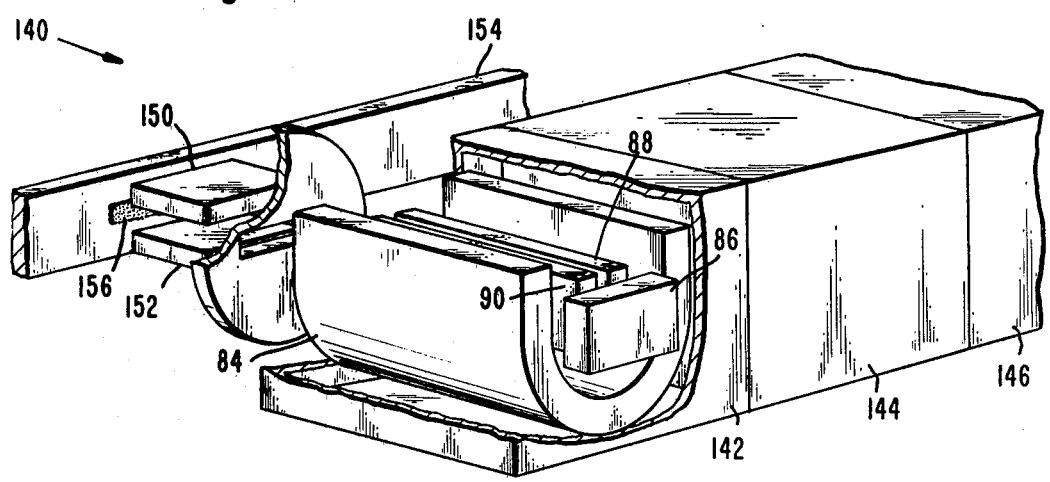
FIG. 9 is an isometric view of a second preferred embodiment of the implantation system of this invention wherein a plurality of compact separated ion sources are arranged adjacent to each other and adjacent a ribbon target which is drawn there past for multiple implantation of the target by the multiple sources.

FIG. 9 shows an ion implantation system 140 which is comprised of a plurality of beam generating units, of which three are shown at 142, 144 and 146. These beam generating units are very similar to the beam generating units of FIG. 8, and the particulars of unit 82 are shown in more detail. The same detail is seen with respect to beam generating unit 142, but note that the beam footprint is horizontal and deflection plates 150 and 152 are arranged for up and down deflection of the beam footprint 156. This arrangement is made because target 154 is a strip being longitudinally advanced across the front of the beam generating units, and the beams are deflected up and down. The footprint 156 of beam generating unit 142 is seen in FIG. 9. It is deflected up and down by the deflection plates 150 and 152, and is arranged to deflect in a crosswise direction with respect to the rectangular shape of the footprint. The structure of FIG. 9 is particularly useful for implanting strips, such as long strips of solar-electric material, surface alloy of metals, or the like. By using a plurality of beam generating units, a sufficiently high total ion current is available so that these procedures can be accomplished. High total dosages of ions can be implanted when a plurality of beam generating units is arranged in parallel. This parallel arrangement can be achieved only with a compact analyzed ion beam source, of the type illustrated. All referenced are incorporated herein in their entirety.

This invention has been described in its presently contemplated best mode and it is clear that it is susceptible to numerous modifications, modes and embodiments within the ability of those skilled in the art and without the exercise of the inventive faculty. Accordingly, the scope of the invention is defined by the scope of the following claims.

What is claimed is:

1. An ion implantation system comprising:
   a plurality of high current separated ion sources, each of said high current ion sources comprising:
   a plasma chamber having an anode and a cathode, a feed supply to said plasma chamber for supplying feed material to be ionized in said plasma chamber, walls defining a narrow rectangular exit slot from said plasma chamber, through which slot ions are extracted along a path to form a high aspect ratio ribbon ion beam of substantially rectangular crosssection and having a height and a thickness;
   magnetic field means for producing in said plasma chamber a magnetic field across said path in the direction of the height of the beam;
   first and second separator electrodes positioned on opposite sides of said path laterally of said path in the thickness dimension of the beam for applying an electric field across said path, said separator electrodes being positioned with respect to said magnetic field means so that said electric field is transverse with respect to said magnetic field to separate unwanted ion species laterally from the ion beam; and
   a target drum rotating on an axis for circumferentially carrying therearound a plurality of target wafers, said plurality of separated ion sources being positioned radially around said target drum, each of said plurality of separated ion sources being positioned to impinge upon the target as the target is moved to provide a multiple implantation on the target.

2. The system of claim 1 further including an analyzer opening positioned downstream along the beam path beyond said separator electrodes, said analyzer opening being an elongated slot positioned substantially parallel to said walls of said exit slot.

3. The system of claim 1 wherein an analyzer opening is positioned along the path of the ribbon ion beam downstream of said separator electrodes, said opening being slot shaped with the width of said slot being in a direction between said separator electrodes and the height of said slot being parallel to said electrodes.

4. The system of claim 1 further including an accelerator electrode positioned adjacent to the beam path to accelerate ions which have been extracted from said exit slot along the beam path so that a separated ion beam having an ion current above 100 microamperes is formed.

5. An ion implantation system comprising:
   a plurality of high current separated ion sources, each of said high current ion sources comprising:
   a plasma chamber having an anode and a cathode, a feed supply to said plasma chamber for supplying feed material to be ionized in said plasma chamber, walls defining a narrow rectangular exit slot from said plasma chamber, through which slot ions are extracted along a path to form a high aspect ratio ribbon ion beam of substantially rectangular crosssection and having a height and a thickness;
   magnetic field means for producing in said plasma chamber a magnetic field across said path in the direction of the height of the beam;
   first and second separator electrodes positioned on opposite sides of said path laterally of said path in the thickness dimension of the beam for applying an electric field across said path, said separator electrodes being positioned with respect to said magnetic field means so that said electric field is transverse with respect to said magnetic field to separate unwanted ion species laterally from the ion beam; and
   a target drum rotating on an axis for circumferentially carrying therearound a plurality of target wafers, said plurality of separated ion sources being positioned radially around said target drum, said deflection plates being positioned to deflect the rectangular ion beams in a direction axially of said target holding drum, each of said plurality of separated ion sources being positioned to impinge upon the target as the target is moved to provide multiple implantation of the target.

6. The ion implantation system of claim 1 wherein each said ribbon beam ion source is in a vacuum envelope and said target is in a separate target chamber;
   a beam slot between said ion beam source vacuum envelope and said target chamber for permitting transmission of ribbon beam from said ion beam source vacuum envelope into said target chamber; and
   a gate for closing off said ion beam opening so that said target chamber can be opened without opening said ion beam source vacum envelope.

7. An ion implantation system comprising:
   a plurality of high current separated ion sources, each of said high current ion sources comprising:
   a plasma chamber having an anode and a cathode, a feed supply to said plasma chamber for supplying feed material to be ionized in said plasma chamber, walls defining a narrow rectangular exit slot from said plasma chamber, through which slot ions are extracted along a path to form a high aspect ratio ribbon ion beam of substantially rectangular cross-section and having a height and a thickness;

magnetic field means for producing in said plasma chamber a magnetic field across said path in the direction of the height of the beam;

first and second separator electrodes positioned on opposite sides of said path laterally of said path in the thickness dimension of the beam for applying an electric field across said path, said separator electrodes being positioned with respect to said magnetic field means so that said electric field is transverse with respect to said magnetic field to separate unwanted ion species laterally from the ion beam; and a longitudinally moving target strip, said plurality of ion sources being positioned in the direction parallel to movement of said target strip, said rectangular ion beams being positioned with their long direction in the direction of movement of the target strip and said deflection plates being positioned to deflect said ion beams transversely of the direction of movement of said target strip to provide a multiple implantation on said target strip.

8. The ion implantation system of claim 7 wherein each said ribbon beam ion source is in a vacuum envelope and said target is in a separate target chamber;

a beam slot between said ion beam source vacuum envelope and said target chamber for permitting transmission of ribbon beam from said ion beam source vacuum envelope into said target chamber; and a gate for closing off said ion beam opening so that said target chamber can be opened without opening said ion beam source vacuum envelope.

9. The system of claim 7 wherein an analyzer opening is positioned along the path of the ribbon ion beam downstream of said separator electrodes, said opening beam slot shaped with the width of said slot being in a direction between said separator electrodes and the height of said slot being parallel to said electrodes.

10. The system of claim 7 further including an accelerator electrode positioned adjacent to the beam path to accelerate ions which have been extracted from said exit slot along the beam path so that a separated ion beam having an ion current above 100 microamperes is formed.

* * * * *